United States Patent [19]

Adam

[11] 4,425,631
[45] Jan. 10, 1984

[54] NON-VOLATILE PROGRAMMABLE INTEGRATED SEMICONDUCTOR MEMORY CELL

[75] Inventor: Fritz G. Adam, Freiburg, Fed. Rep. of Germany

[73] Assignee: ITT Industries, Inc., New York, N.Y.

[21] Appl. No.: 287,835

[22] Filed: Jul. 29, 1981

[30] Foreign Application Priority Data

Aug. 4, 1980 [DE] Fed. Rep. of Germany ....... 3029539

[51] Int. Cl.$^3$ ............................................. G11C 11/40
[52] U.S. Cl. ...................................... 365/185; 357/23
[58] Field of Search .................. 365/185; 357/23 VT

[56] References Cited

U.S. PATENT DOCUMENTS

| | | | |
|---|---|---|---|
| 4,037,242 | 7/1977 | Gosney | 365/185 |
| 4,274,012 | 6/1981 | Simko | 357/23 VT |
| 4,314,265 | 2/1982 | Simko | 365/185 |

*Primary Examiner*—Stuart N. Hecker
*Attorney, Agent, or Firm*—John T. O'Halloran; Peter R. Ruzek

[57] ABSTRACT

A non-volatile programmable integrated semi-conductor cell comprises a semiconductive substrate of one conductivity type, a reading insulated-gate field effect transistor partially incorporated in said substrate and having an insulated gate at the active surface of the substrate, and a floating gate electrode juxtaposed with and extending beyond the boundaries of the insulated gate, a pair of programming electrodes constituted by planar regions of the other conductivity type in the substrate, including a writing electrode and an erasing electrode each having an insulated gate of a thickness permitting junction crossing by hot carriers in partial overlap with floating gate electrode for capacitative coupling thereto, the region of overlap at said writing electrode being larger than that at said erasing electrode, and a diffusion region of the one conductivity type in said substrate next to and at a small distance from said writing electrode and having a surface area smaller than that of said writing electrode, at least partially, juxtaposed with the floating gate. The reading and writing electrodes may be integral with the source and drain regions of the reading field effect transistor.

8 Claims, 9 Drawing Figures

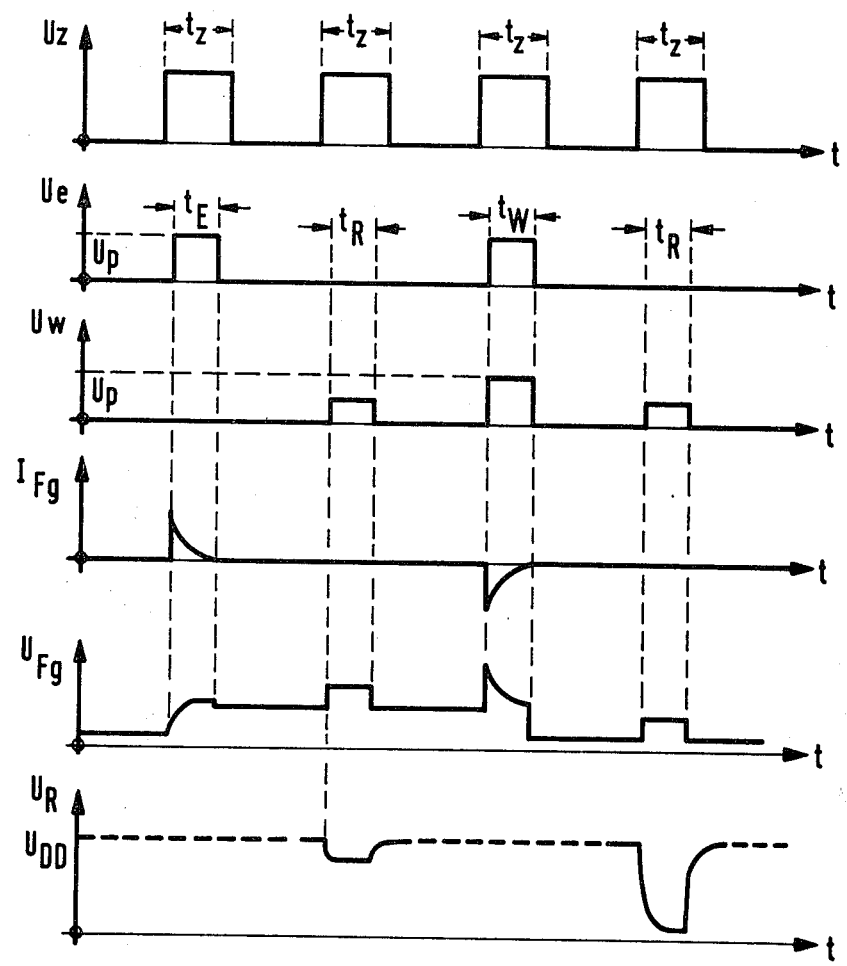

NON-VOLATILE PROGRAMMABLE INTEGRATED SEMICONDUCTOR MEMORY CELL

BACKGROUND OF THE INVENTION

The present invention relates to a non-volatile programmable integrated memory cell.

A nonvolatile, programmable integrated semiconductor memory cell containing a reading (sensing) FET with a floating gate at normal supply voltage is known from the technical journal "IEEE Transactions on Electron Devices" Vol. ED-24, No. 5 (May 1977), pp. 594 to 599. In this conventional type of semiconductor memory cell, the gate electrode, which has a square configuration, extends beyond the gate surface of the reading IGFET and is capacitatively coupled via two surface portions of insulated-gate parts having a thickness permitting the crossing of the junction by hot carriers, to two programming electrodes, namely, one writing electrode and one erasing electrode, which are formed by planar regions of one conductivity type in a semiconducting substrate of the other conductivity type. The programming electrodes form $p^+$-n or $n^+$-p junctions, with the $p^+$-n junction injecting hot holes, and the $n^+$-p junction injecting hot electrons into the adjacent insulated-gate portions of the insulated-gate layer as soon as the breakdown voltage of one of the junctions is exceeded and an avalanche breakdown is initiated. When the insulated-gate portions adjoining the programming electrodes are suitably thin, a small fraction of the hot charge carriers tunnels through the insulated-gate portions and charges or discharges the floating potential gate electrode. The insulated-gate portions of the insulated gate layer which can be tunnelled by the hot charge carriers are restricted in the above-mentioned conventional memory cell to a narrow band adjacent to the punch-through line of the $p^+$-n or $n^+$-p junction, at the interface semiconductor substrate-insulated-gate layer. The involved insulated-gate portions of the insulate gate layer, therefore, are relatively quickly damaged so that only a relatively low number of programming cycles can be accomplished without causing any substantial damage.

SUMMARY OF THE INVENTION

Accordingly, it is an object of the invention to increase the number of possible programming cycles as compared to the considerably restricted number of such cycles possible in the conventional type of semiconductor memory cell.

It is well known that this number is restricted due to the fact that the difference between an upper threshold voltage and a lower threshold voltage, referred to as the threshold voltage window, gradually decreases as the number of programming cycles increases.

The invention is based on the realization that this disadvantageous effect is attributable to a damaging of the gate insulator, and that the area of passage of the hot-charge carriers is to be enlarged in order thus to distribute the charge of the insulated-gate layer over a larger surface area.

In pursuance of the above object and other objects which will become apparent hereafter, one feature of the present invention resides in a non-volatile programmable integrated semi-conductor cell which comprises a semiconductive substrate of one conductivity type having an active surface; a reading insulated-gate field effect transistor (IGFET) including a part incorporated in the substrate and having an insulated gate at the active surface, and a floating gate electrode having a main portion juxtaposed with the insulated gate and extensions contiguous with the main portion and disposed along the active surface beyond the boundaries of the insulated gate; a pair of programming electrodes constituted by planar regions of the other conductivity type in the substrate, including a writing electrode and an erasing electrode each having an insulated gate of a thickness permitting junction crossing by hot carriers in partial overlap with the extensions of the floating gate electrode for capacitative coupling thereto, the region of overlap at the writing electrode being larger than that at the erasing electrode; and a diffusion region of the one conductivity type in the substrate next to and at a small distance from the writing electrode and having a surface area smaller than that of the writing electrode, the respective extension of the floating gate being juxtaposed with at least a portion of the surface area of the diffusion region, so that the recharging of the floating gate electrode is effected by minority carrier injection which takes place during the writing operation through the surface area portion of the diffusion region in the form of a current of hot minority carriers originating in the substrate, and during the erasing operation through the insulated gate of the erasing electrode.

Advantageously, space-saving features can be incorporated in the memory cell in accordance with further aspects of the invention. Thus, for example, either the writing electrode or the erasing electrode can be designed to form a continuous region with either the source region or the drain region of the reading IGFET.

Moreover, the lateral spacing between the writing electrode and the diffusion region should generally be somewhat smaller than the width of the field region which is formed in the substrate when the writing voltage is applied to the writing electrode, for sucking off the charge carriers in the substrate which are produced during the avalanche breakdown and which do not tunnel through the insulated-gate layer.

The coupling capacitance which the writing electrode forms with the gate electrode via the adjacent insulated-gate portion, should be at least eight times greater than the coupling capacitance formed by the erasing electrode, via the adjacent insulated-gate portion, with the gate electrode.

BRIEF DESCRIPTION OF THE DRAWINGS

Above-mentioned and other features and objects of this invention will become more apparent by reference to the following description taken in conjunction with the accompanying drawings, in which:

FIG. 9 is a graphic representation of the pulse sequences during the programming and the reading of the memory cells as shown in FIGS. 5 or 8.

DETAILED DESCRIPTION OF THE PREFERRED EMBODIMENTS

Figure 1:
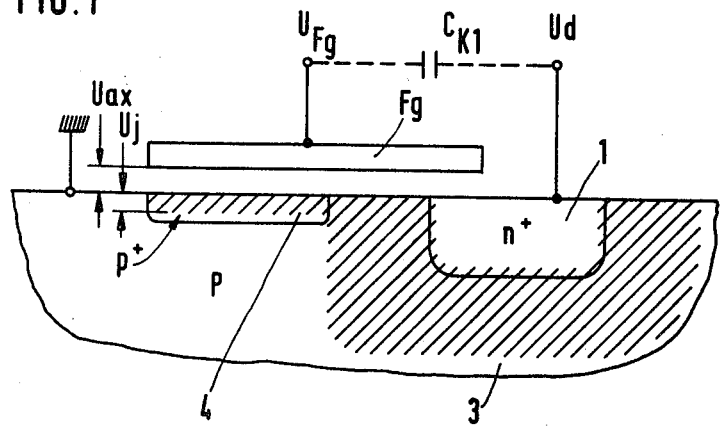
FIGS. 1 and 2 are diagrammatic cross-sectional views of the cell of the present invention including only as much detail as needed to explain the mode of operation of the diffusion areas effective as minority injectors.

For explaining the mode of operation of a diffusion region inserted into the substrate for serving as an area minority injector in a semiconductor memory cell according to the invention, reference is being had first to FIG. 1 which shows the cross-sectional view taken through a floating gate electrode Fg, as well as through a writing electrode 1 constituted by a planar region within a substrate 3, and through a diffusion region 4 which is of planar design. A field region of the pn junction of the writing electrode 1, which is indicated by hatching, reaches the diffusion region 4 and overlaps it by a small amount.

For calculating the voltage Uj which is decisive for the avalanche breakdown on the semiconductor surface, the substrate 3 is connected to ground. With voltage $U_{Fg}$ being applied to the gate electrode Fg and the voltage Ud to the writing electrode 1, there is obtained, starting with $$Uj = U_{Fg} \frac{Cox}{Cox + Cj} \text{ and } Cj = \frac{\epsilon_s \cdot q \cdot N}{2 \, Uj},$$

wherein the abbreviation Cox stands for the oxide capacitance, Cj for the capacitance as applied to Uj, $\epsilon_s$ for the dielectric constant of silicon, q for the elementary charge, and N for the doping concentration of the p-doped diffusion region 4 on the surface, the equation $$Uj = U_{Fg} + \frac{\epsilon_s \cdot q \cdot N}{Cox^2} - \sqrt{\left(U_{Fg} + \frac{\epsilon_s \cdot q \cdot N}{Cox^2}\right)^2 - U_{Fg}^2}$$

Calculations and experiments carried out by using the aforementioned equation have shown that suitable programming voltages in the range between 20 and 35 V are obtained when the net doping concentration has the relationship $$\frac{N}{cm^{-3}} \geq 2.6 \cdot 10^{17} \cdot \left(\frac{Up}{20 \, V}\right)^{-\frac{1}{2}}$$

and the thickness Xox of the dielectric of silicon oxide as thermally grown on a silicon substrate, of the two coupling capacitances between the writing and the erasing electrode, on the one hand, and the gate electrode Fg, on the other hand, has the relationship $$\frac{Xox}{\text{Å}} = 665 \cdot \left(\frac{Up/V}{N/10^{16} \, cm^{-3}}\right)^{\frac{1}{2}} \pm 5\%$$

wherein Vp indicates the programming voltage to be applied to the writing electrode.

In this case, the surface area forming the coupling capacitance $C_{K1}$ of the writing electrode 1 to the gate electrode Fg should be so dimensioned as to be at least eight times greater than the surface area forming the coupling capacitance of the erasing electrode 2, of the insulated-gate layer to the (floating) gate electrode Fg.

Figure 2:
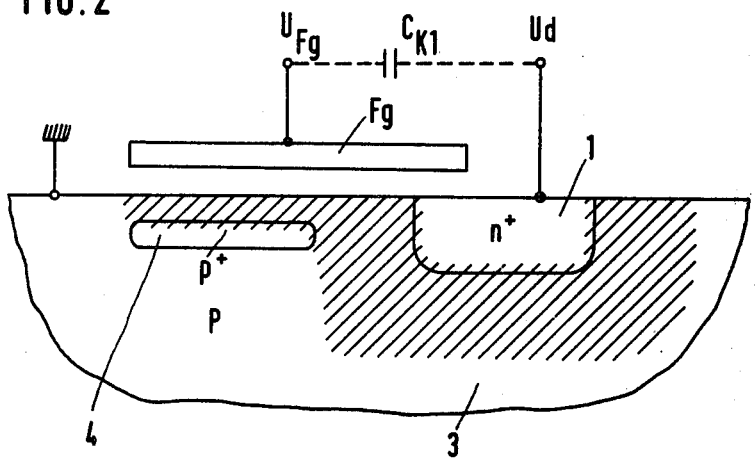

The diffusion depth of the diffusion region 4 according to the embodiment of FIG. 1 may amount to about 1 μm. The diffusion region 4, however, as is shown in FIG. 2, may also be positioned within fractions of 1 μm below the semiconductor surface. In this respect, it is to be assured that the field region fills the space between the semiconductor surface and the diffusion region 4. The diffusion region 4 according to FIG. 2, which is placed below the semiconductor surface, may be obtained either by ion implantation or by sub-epitaxial diffusion.

Basically, the semiconductor memory cell according to the invention is programmed in that the programming voltage, during the writing, is momentarily applied to the writing electrode 1 as coupled via the larger capacitance $C_{K1}$ and, during the erasing, to the erasing electrode 2 coupled via the smaller capacitance, while the respective other programming electrode has the potential of the substrate applied thereto. During the writing operation, however, the same programming voltage Up, besides being applied to the writing electrode 1, may also be applied to the erasing electrode 2. The sign of the programming voltage Up, of course, depends on the conductivity type of the reading (sensing) IFGET. In the event that the memory cell according to the invention is an n-channel cell, a positive sign is to be chosen for the programming voltage Up, and in the event that the memory cell according to the invention is a p-channel cell, a negative sign is to be chosen for the programming voltage Up, with respect to the potential of the substrate 3. During the reading of a semiconductor memory cell according to the invention, a voltage is applied to the writing electrode 1, which is substantially lower than the programming voltage Up and lower than the relatively high threshold voltage of the reading IFGET Tr, as obtained during the writing. The reading IGFET Tr can be switched as a source follower during the reading operation. One example of embodiment of a memory cell according to the invention comprising a special reading line L is shown in a cross-sectional view in FIG. 3. In this type of embodiment both the writing electrode 1 and the erasing electrode 2 have been diffused separately from the source region 5 and the drain region 6 of the reading IGFET Tr, into the one surface side of the plate-shaped substrate 3. The insulated-gate portions 7 and 9 over the erasing electrode 2 or the diffusion region 4 are to be dimensioned so thin as referred to in the text relating to FIGS. 1 and 2, so as to enable the junction crossing of hot carriers. The insulated-gate portion 8 over the writing electrode is preferably to be given the same thickness.

Since the semiconductor memory cell according to the invention is intended for use in a memory matrix (columnwise), writing lines W and erasing lines E are provided. While the writing electrode 1 is capable of being charged via the source-drain line of the writing transistor Tw, the erasing electrode can be connected to the erasing line E via the erasing transistor Te, as soon as suitable potential is applied to the word line Z. In this way, the bitwise programming of the memory matrix becomes possible. In further embodying the memory matrix according to FIG. 3, and for space-saving reasons, the erasing electrode 2 and the drain region 6 of the reading IGFET Tr are combined to form one common region 26, as can be easily recognized from FIG. 4.

Figure 5:
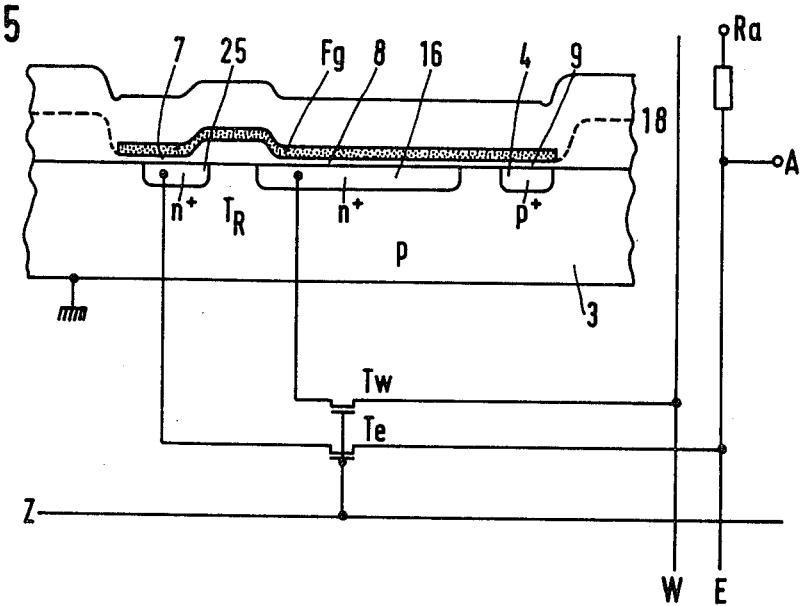
FIG. 5 is a view similar to FIGS. 1 and 2 but showing, in the same cross-sectional view, another space-saving, embodiment of the invention.
Figure 6:
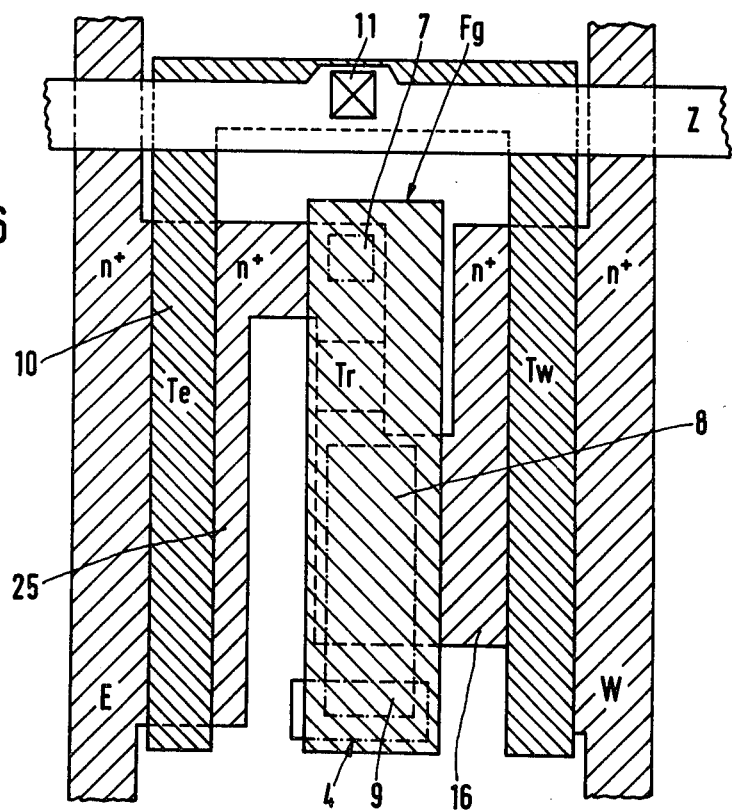
FIG. 6 is a top plan view of the plate-shaped substrate showing the topology of the memory cell of FIG. 5 as realized in a silicon gate design.
Figure 7:
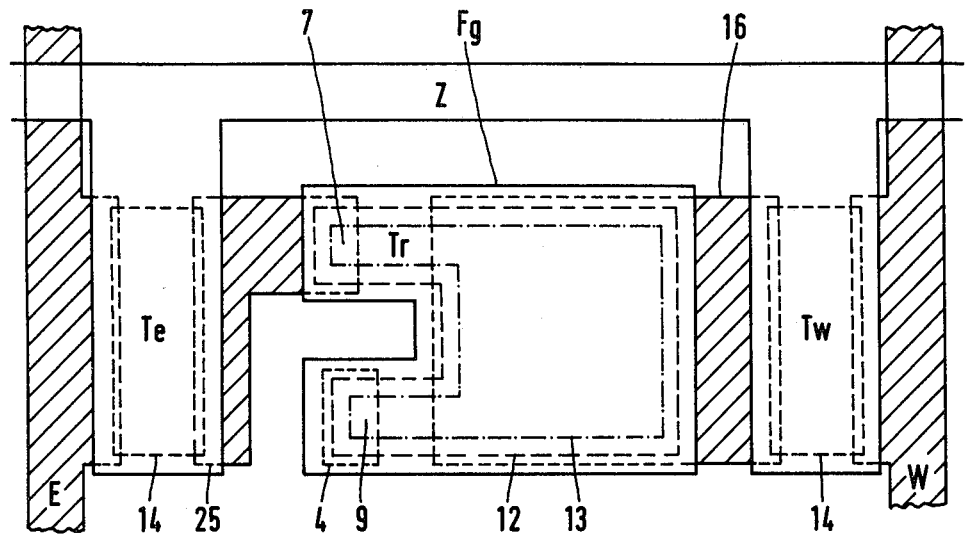
FIG. 7 is a view similar to FIG. 6 but showing the topology of the memory cell of FIG. 5 as realized in an aluminum-gate design.
Figure 8:
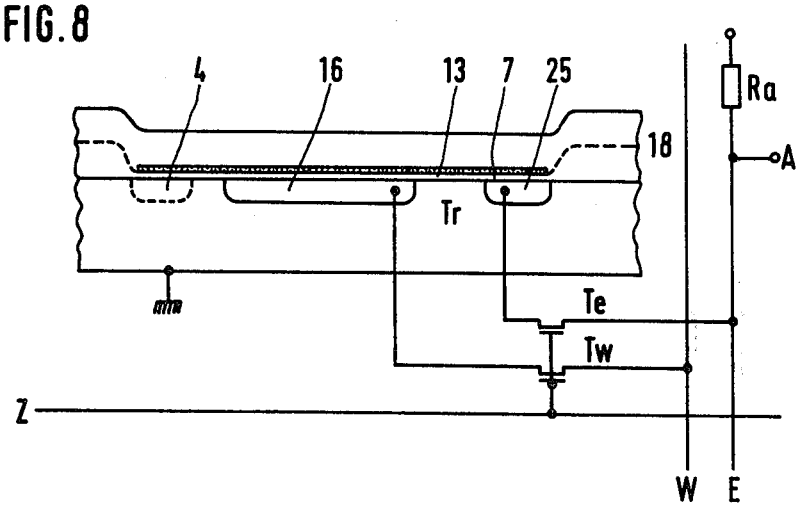
FIG. 8 is a view similar to FIGS. 1, 2, and 5 but showing a further embodiment elaborating on the concepts embodied in the memory cell of FIG. 5.

In following up the thought of combining regions for the sake of saving space, which is extremely important in designing memory matrices, to its further consequences, the planar writing electrode 1 as well as the planar erasing electrode 2 are each combined with one of the regions of the reading IGFET Tr, as is shown in the further examples of embodiment 1 of FIGS. 5 to 8. In these examples of embodiment, as is shown in FIGS. 5 and 8, the source region has been combined with the planar erasing electrode 2 to form the continuous region 25, and the planar writing electrode has been combined with the drain region to form a continuous region 16. A dash line 18 indicates that, subsequently to the production of the (floating) gate electrode Fg, the entire arrangement has been covered with a protective layer deposited thereon.

FIG. 6 shows, in a top view of the plate-shaped substrate, how the memory cell according to FIG. 5 can be topologically realized in accordance with the well-known silicon gate technology. The portions of n+ diffused regions which are not covered by conducting leads or electrodes and in which, among others, both the writing line W and the erasing line E, have been formed as n+-doped zone strips, are indicated by hatching oriented in the same direction. These portions have been diffused by employing parts of a U-shaped layer of a polycrystalline silicon serving as the diffusion masking in accordance with the aforementioned technology, in the course of which diffusion operation, apart from the already mentioned lines E and W, the further regions of the erasing transistor Te and of the writing transistor Tw are diffused.

Prior to this diffusion, there are produced the n+- doped region portions which lie below the gate electrode, and the p+-doped diffusion region 4, during separate diffusion operations. This is because then the U-shaped portion and the silicon of the gate electorde Fg can be deposited first as a single layer in the course of a single process step. The portions of this polysilicon layer remaining after an etching operation, and to the extent not covered by the word line Z, are indicated by hatchings oriented differently then those indicating the n+-doped regions. FIG. 6 further shows in dotted box form the thinly insulated-gate portions 7 and 8 over the regions 16 and 25.

The word line Z of aluminum vapor-deposited on an insulating layer extends transversely of the diffused lines E and W. This insulating layer contains a contacing window 11 in which the word line Z contacts the polysilicon lying therebeneath.

FIG. 7 shows, as a further example of embodiment, the topological design of a semiconductor memory cell according to FIG. 5 produced by using well-known concepts of aluminum-gate technology. In this structure, the regions whose portions are not covered by electrodes or conducting leads, which are hatchlined in FIG. 7, as well as the diffusion region 4, are diffused into the semiconductor body prior to the evaporation deposition of aluminum. The dashed lines 13 and 14 indicate the bordering lines of the insulated-gate portions or of the gate-oxide layers of the transistors Te and Tw. The aluminum material of the word line Z, of the gate electrodes of the two transistors Te and Tw is deposited together with the material of the (floating) gate electrode Fg, and thereafter the area of the word line Z as bordered according to FIG. 7 is etched away by employing a photolithographic etching process together with the gate electrodes of the two transistors Te and Tw which are in connection therewith, as well as with the gate electrode Fg.

On this occasion it should be remarked that the material selected for the gate electrode Fg is of no importance with respect to the function of the memory cell according to the invention, because the injection of the electrons and holes is effected during the charging or discharging of the gate electrode Fg, from below out of the semiconductor material. Accordingly, there are virtually no restrictions in the selection of the technologies; the gate electrode Fg can be made in the same way either from a metal or from a doped semiconductor material.

In further developing the embodiment of FIG. 5, the insulated-gate portions over the regions 16 and 25 are shown to have the same thickness as those of the reading IGFET Tr as can be easily recognized from FIG. 8. This type of embodiment offers the advantage over that of FIG. 5, that it is easier to produce.

For the reading of a memory cell according to the invention arranged within a semiconductor matrix, a voltage is applied to associated word line Z which is equal to or lower than the programming voltage.

Figure 3:
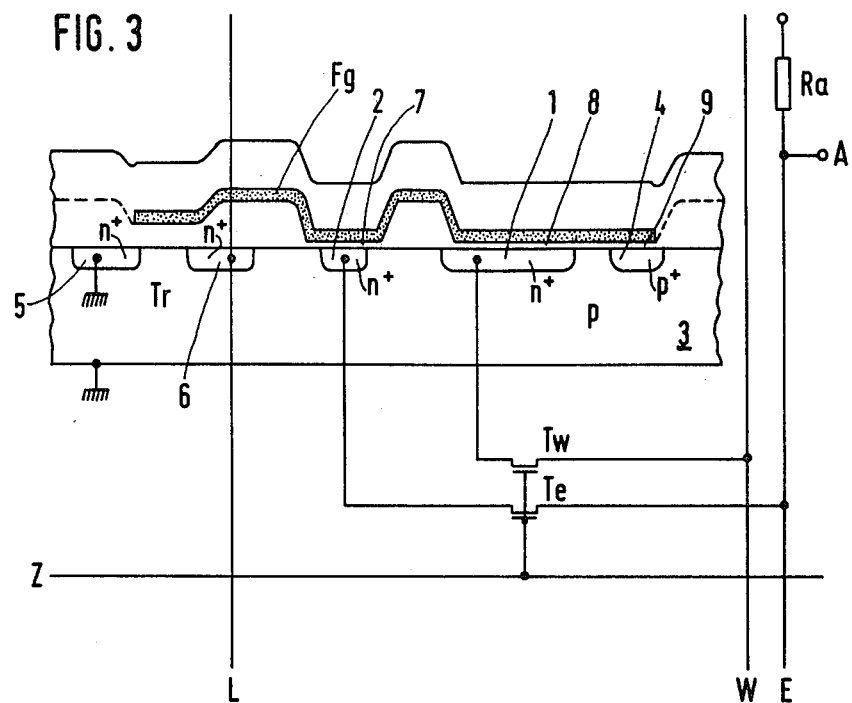
FIGS. 3 and 4 are diagrammatic partial cross-sectional views of two similar embodiments of the present invention taken in a plane normal to a plate-shaped substrate.

For this purpose, in a semiconductor memory cell according to FIG. 3, the two associated bit lines, namely the writing line W and the erasing line E, are brought to a common reading potential which, at most, is approximately half as high as the programming voltage. At the same time, all remaining word and bit lines have the substrate potential applied thereto.

Figure 4:
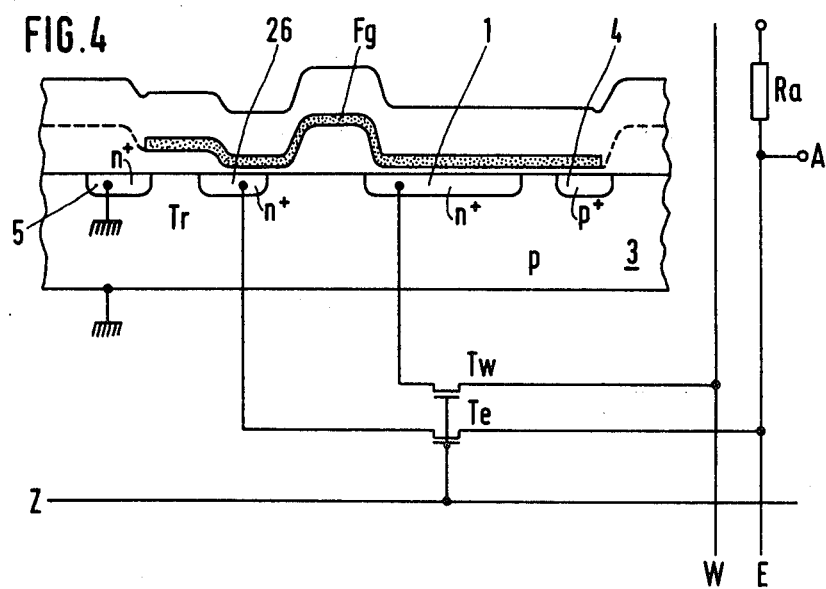

For reading a semiconductor memory cell according to FIGS. 4, 5, or 8, i.e. a semiconductor memory cell in which the source- and/or the drain-region of the reading IGFET Tr are designed as continuous regions contiguous with the planar erasing electrode, merely the writing line W is applied to a reading potential which, at most, is approximately half as high as the programming voltage, while the substrate potential is applied to the erasing line across a resistance element Ra, for example, a high ohmic transistor driven into saturation, as well as to the word and bit line of the remaining memory cells which are not to be read. The stored information is taken off the resistance element Ra at A, so that the erasing transistor Te operates as a source follower.

FIG. 9 illustrates the pulse sequences of the voltages on the word line Z, the erase line E, the write line W, the (floating) gate electrode Fg with reference to ground potential, and the voltage $U_R$ as dropping off across the read transistor Tr in the course of one erase-read-write-read cycle. These functions, of course, must be performed within time intervals $t_Z$ during which the write transistor Tw and the erase transistor Te are switched into the conducting state in that a voltage Uz is applied to the word line Z. During the first function interval "Erase" a pulse Up of the width $t_E$ is applied to the erase line E, as can be seen from the second line in FIG. 9, in which the voltage Ue is plotted as function of time. Simultaneously, the voltage Uw of the write electrode is reduced to zero. Charge carriers are drawn from the gate electrode Fg, in the course of which, momentarily, a decreasing charge carrier current is drawn as is shown in line 4 of FIG. 9, in which the dependence of the charge or discharge currents of the gate electrode Fg is plotted as a function of time. Accordingly, the potential of the gate electrode Fg is changed, as is shown in line 5 of FIG. 9.

During the following function interval "Read" a pulse which is substantially smaller than Up is applied to the write line W, as is shown in line 3 of FIG. 9, in which there is plotted the dependence of the voltage Uw on the write line as a function of time. During this interval $t_R$, the voltage as shown in the last line of FIG. 9 can be taken off the read transistor Tr.

During the subsequently following function interval "Write", the Up-pulses of the duration $t_W$ as shown in the second and third lines of FIG. 9 are applied to both the erase line E and the write line W, so that the charging current as shown in line 4 of FIG. 9 is injected into the gate electrode Fg and, accordingly, a variation of the voltage $U_{Fg}$ is obtained.

In the fourth function interval "Read", during which the now blocked read transistor Tr is being sensed there results the voltage characteristic $U_R$ as shown in the last line of FIG. 9.

While I have described above the principles of my invention in connection with specific apparatus, it is to be clearly understood that this description is made only by way of example and not as a limitation to the scope of my invention as set forth in the accompanying claims.

I claim:

1. A non-volatile programmable integrated semi-conductor cell comprising
   a semiconductive substrate of one conductivity type having an active surface;
   a reading insulated-gate field effect transistor (IGFET) including a part incorporated in said substrate and having an insulated gate at said active surface, and a floating gate electrode having a main portion juxtaposed with said insulated gate and extensions contiguous with said main portion and disposed along said active surface beyond the boundaries of said insulated gate;
   a pair of programming electrodes constituted by planar regions of the other conductivity type in said substrate, including a writing electrode and an erasing electrode each having an insulated gate of a thickness permitting junction crossing by hot carriers in partial overlap with said extensions of said floating gate electrode for capacitative coupling thereto, the region of overlap at said writing electrode being larger than that at said erasing electrode; and
   a diffusion region of said one conductivity type in said substrate next to and at a small distance from said writing electrode and having a surface area smaller than that of said writing electrode, the respective extension of said floating gate being juxtaposed with at least a portion of said surface area of said diffusion region, so that the recharging of said floating gate electrode is effected by minority carrier injection which takes place during the writing operation through said surface area portion of said diffusion region in the form of a current of hot minority carriers originating in said substrate, and during the erasing operation through the insulated gate of said erasing electrode.

2. A semiconductor memory cell as claimed in claim 1, wherein the lateral spacing between said writing electrode and said diffusion region is somewhat smaller than the width of the field zone which is formed in said substrate when the writing voltage is applied to said writing electrode.

3. A semiconductor memory cell as claimed in claim 1, wherein said reading IGFET has a source region; and wherein one of said programming electrodes forms a continuous zone with said source region.

4. A semiconductor memory cell as claimed in claim 1, wherein said reading IGFET has a drain region; and wherein one of said programming electrodes forms a continuous zone with said drain region.

5. A semiconductor memory cell as claimed in claim 1, wherein said reading IGFET has a source region and a drain region; and wherein said writing electrode forms a continuous zone with said drain region and said erasing electrode forms another continuous zone with said source region.

6. A semicondutor memory cell as claimed in claim 1 wherein the programming voltage Up, the net doping concentration N of at least one partial area of said erasing electrode whose marginal line is overlapped by the surface portion of said gate electrode forming the coupling capacitance, and the thickness Xox of the dielectric of the two coupling capacitances are chosen in accordance with the following relationships:

$$20 \text{ V} \leq Up \leq 35 \text{ V}$$

$$\frac{N}{\text{cm}^{-3}} \geq 2.6 \cdot 10^{17} \left(\frac{Up}{20 \text{ V}}\right)^{-\frac{1}{2}}$$

$$\frac{Xox}{\text{Å}} = 665 \cdot \left(\frac{Up/\text{V}}{N/10^{16} \text{ cm}^{-3}}\right)^{\frac{1}{2}} \pm 5\%$$

7. A semiconductor memory cell as claimed in claim 1, wherein the surface portion of the extension of said floating gate electrode which forms the coupling capacitance with said writing electrode is at least eight times greater than the surface portion of the extension of said floating electrode which forms the coupling capacitance with said erasing electrode.

8. A semiconductor memory cell as claimed in claim 1, wherein said floating gate electrode consists of a metal.

* * * * *